United States Patent [19]

Pichon

[11] 4,068,166
[45] Jan. 10, 1978

[54] METHOD AND APPARATUS FOR MEASURING PERCENT ERROR OF AN IMPEDANCE

[75] Inventor: Michel Pichon, Fontenay-sous-Bois, France

[73] Assignees: Compagnie Internationale pour l'Informatique; Cie Honeywell Bull, both of aris, France

[21] Appl. No.: 755,058

[22] Filed: Dec. 28, 1976

[30] Foreign Application Priority Data

Dec. 31, 1975 France ............................... 75.40364

[51] Int. Cl.² .......................................... G01R 27/02
[52] U.S. Cl. ................................... 324/62; 323/75 N
[58] Field of Search ................. 324/62, 57 R, DIG. 1; 323/75 N

[56] References Cited

U.S. PATENT DOCUMENTS

| | | | |
|---|---|---|---|
| 1,324,818 | 12/1919 | Hazard | 324/62 |
| 2,468,625 | 4/1949 | Goetz | 324/62 |
| 2,980,852 | 4/1961 | Mell | 324/62 X |
| 3,539,918 | 11/1970 | Boyd | 324/62 |

*Primary Examiner*—Stanley T. Krawczewicz
*Attorney, Agent, or Firm*—Lowe, King, Price & Markva

[57] ABSTRACT

The percent error in the value of a resistor, relative to a nominal value ($R_n$) of the resistor is determined automatically with a Wheatstone bridge having first and second branches energized by a voltage source. The first branch includes first and second series connected resistors respectively having values P and Q. The second branch includes third and fourth series connected resistors respectively having values R and A; the third resistor is the resistor being measured for percent error. The fourth resistor has a value to establish bridge balance when $R = R_n$. A diagonal is connected across a common terminal of the first and second resistors and a common terminal of the third and fourth resistors. A voltage source driving the two branches in parallel has a value in accordance with:

$$E = \frac{(k+1)^2 \cdot 10^m}{k} + (k+1)u$$

where:
$k = P/Q$ and is much less than 1,
$u = $ the voltage across the diagonal that is directly proportional to the percent error, and
$m = $ an integer.

The bridge energizing voltage is derived from a fixed voltage source, as well as a variable voltage source that is responsive to the bridge diagonal voltage.

15 Claims, 2 Drawing Figures

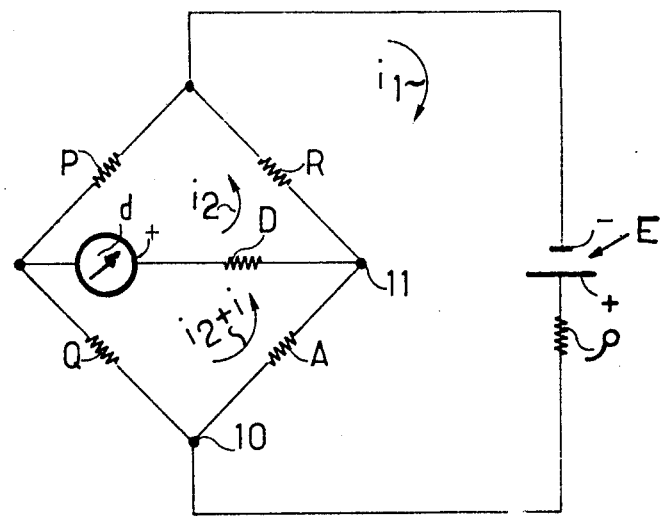
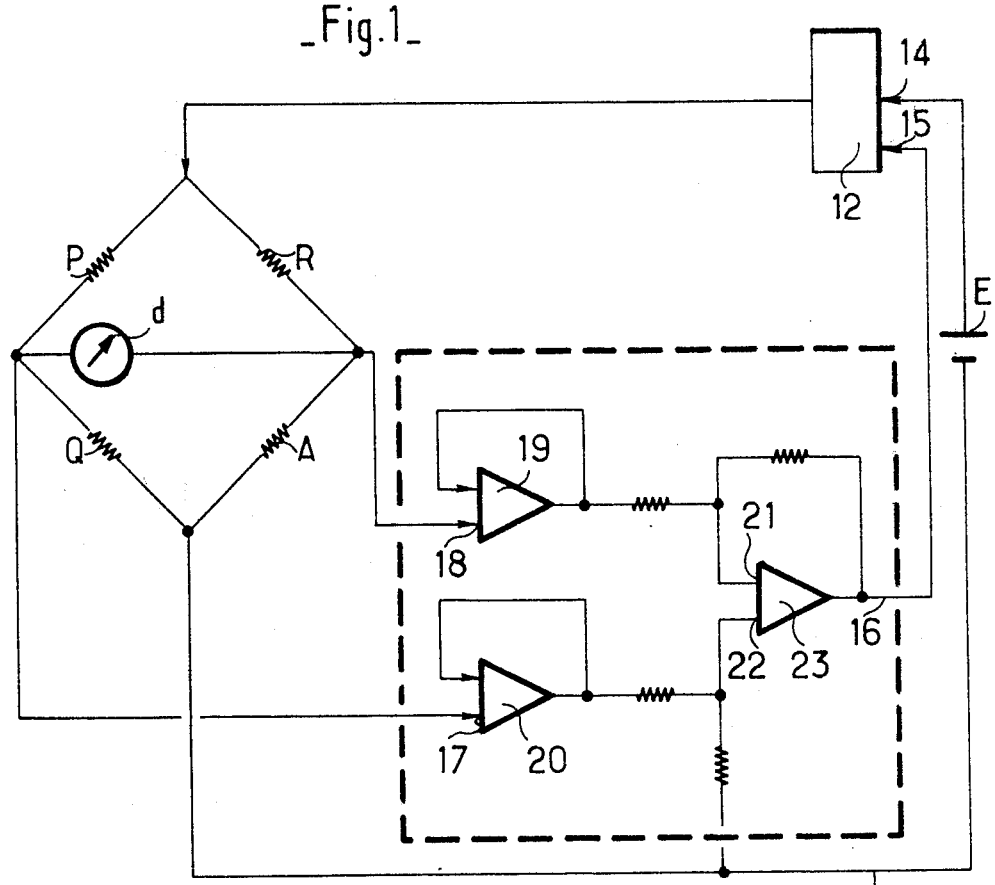
_Fig.1_
_Fig.2_

METHOD AND APPARATUS FOR MEASURING PERCENT ERROR OF AN IMPEDANCE

FIELD OF THE INVENTION

The present invention relates generally to Wheatstone bridge measuring circuits and more particularly to a Wheatstone bridge measuring circuit wherein the percentage error in the value of an impedance is automatically indicated by the voltage across a diagonal of the bridge.

BACKGROUND OF THE INVENTION

Impedances, and particularly resistors as generally manufactured, include two indications; one indication is of a nominal value while the second indicates the tolerance of the impedance from the nominal value. Tolerance actually is an indication of the tolerable percent error of the impedance value from the nominal value, and therefore, is indicated in percentage, e.g., 5%, 10%, etc.

One prior art apparatus and method for determining the tolerance of an impedance includes a Wheatstone bridge as an impedance measuring device. However, the use of a Wheatstone bridge is relatively time consuming when it is necessary to monitor the exact value of many impedances used for industrial purposes. Because it is necessary to monitor the value of many impedances for industrial purposes, it is desirable to reduce the measuring time to determine the tolerance of the impedance and to simplify the steps required by an operator to determine if the impedances have the desired tolerance. With the prior art techniques, it is necessary for an operator to frequently adjust the bridge to determine each particular impedance tolerance measurement.

BRIEF DESCRIPTION OF THE INVENTION

The present invention enables an operator to obtain automatically a constant factor indicative of the percent error, i.e., tolerance, of the value of an impedance compared to the nominal value of the impedance. With the particular apparatus, consecutive measurements of impedances having the same indicated nominal value are rapidly performed so that there is an appreciable decrease in the amount of time required to determine if a particular impedance has a desired tolerance. With the present invention, it is possible to attain a direct reading of the tolerance of the impedance value. The apparatus is useful in the manufacture of electronic apparatus that must use components having predetermined tolerances and to assure that the components have these tolerances before they are inserted into an apparatus to be manufactured.

In accordance with the invention, the tolerance of an impedance is directly read from an indicator, in percentage error of nominal value. The apparatus includes a Wheatstone bridge having a first branch including first and second series connected impedances of the same type, having values P and Q, and a second branch having third and fourth series connected impedances of the same type, with values designated by R and A. A diagonal of the bridge, connected to common points of the impedances of each branch, includes a voltage detector that directly indicates percent error. The apparatus is particularly characterized by an energizing voltage source connected to drive the two branches in parallel, wherein the voltage of the source is given by the relation:

$$E = \frac{(k+1)^2 \cdot 10^m}{k} + (k+1)u \tag{1}$$

where:
$k = P/Q$ and is much less than 1,
$u =$ the imbalance voltage of the bridge across the diagonal, and
$m =$ an integer.

With the bridge voltage selected in accordance with Equation (1), the voltage read by the detector in the bridge diagonal is directly proportional to the percent error of the third impedance, if the bridge is initially in a balanced condition such that the value of the fourth impedance is adjusted to achieve bridge balance when the third impedance has the nominal value, $R_n$.

To enable the energizing voltage for the bridge to be as indicated by Equation (1), a voltage source for the bridge includes a constant component represented by $$\frac{(k+1)^2}{k} \cdot 10^m,$$

and a variable component directly proportional to the bridge diagonal voltage, as represented by $(k+1)u$. "$m$" is depending of the selected scale on the voltage detector.

It is, accordingly, an object of the present invention to provide a new and improved Wheatstone bridge circuit.

Another object of the invention is to provide a Wheatstone bridge measuring circuit for automatically enabling the percent error of an impedance to be indicated.

Another object of the invention is to provide a Wheatstone bridge measuring circuit for directly indicating, with the voltage derived between diagonals of the bridge, the percent error of an impedance being monitored.

Another object of the invention is to provide a new and improved apparatus for and method of controlling the voltage applied to a Wheatstone bridge so that the voltage across a diagonal of the bridge is directly proportional to the percent error of a resistor being monitored by the bridge.

These and other objects and advantages of this invention will become apparent upon reading the following description, of which the attached drawings form a part.

BRIEF DESCRIPTION OF THE DRAWING

FIG. 1 is a circuit diagram of a Wheatstone bridge to aid in describing the functioning of the measuring apparatus of the present invention; and FIG. 2 is a combined circuit and block diagram of a preferred embodiment of the apparatus in accordance with the invention.

While the drawing is described in connection with measuring the percentage error of a resistor, it is to be understood that the principles of the invention apply to any impedance.

DETAILED DESCRIPTION OF THE DRAWING

Reference is now made to FIG. 1 of the drawing wherein there is illustrated a Wheatstone bridge energized by a DC voltage source E. The bridge includes a first branch containing series resistors P and Q, having a ratio P/Q that is equal to a value $k$. A second branch of the bridge includes resistor R, the tolerance or percentage error of which is to be determined relative to a nominal value $R_n$. Resistor R is connected in series with variable, calibrating resistor A. As is seen infra, the voltage of detector $d$ is directly proportional to the percentage error of resistor R relative to the nominal value $R_n$. (The values of source E and resistors P, Q, R and A are respectively indicated by E, P, Q, R, and A.)

Each branch of the bridge includes a tap having a common connection with the two resistors forming the branch. Thereby, each branch of the bridge can be considered as a voltage divider so that a constant voltage $kE/(k+1)$ is derived at the tap of the first branch, and a variable voltage is derived at the tap of the second branch; the variable voltage is dependent upon the percent error of resistor R from the nominal value $R_n$ and the value of resistor R. A diagonal of the bridge is formed between the taps of the two branches. The diagonal includes a voltage detector $d$ having an internal resistance D which is much greater than the values of any of the resistors P, Q, R or A. Thereby, relatively small currents flow through the diagonal of the bridge even if there is an appreciable bridge imbalance. The internal impedance $\rho$ of source E is much lower than the values of any of resistors P, Q, R or A, as well as the internal resistance D of detector $d$. Typically, detector $d$ is a voltmeter, but in certain applications, it is advantageous to connect a high impedance recorder in parallel with the voltmeter, or in place of the voltmeter.

In response to the voltage of source E and the values of resistors P, Q, R and A, as well as the internal impedance of voltage detector d, numerous mesh currents flow in the circuit. In particular, the mesh current $i_1$ flows from source E to the bridge, mesh current $i_2$ flows through resistors P and R, a current $i$ flows through the diagonal, and a current $(i_2+1)$ flows through resistors Q and A. The different elements of the bridge and the value of source E are selected to obtain a direct correspondence between the voltage read from detector d and the percentage error in the value of resistor R relative to the nominal value of the resistor.

If the true value of resistor R is given by R and the nominal value is given by the term $R_n$, the bridge directly indicates the percentage error, X, compared to the nominal value as:

$$X = \frac{100(R - R_n)}{R_n} \quad (2)$$

By utilizing the Kirchoff current and voltage laws, it is possible to write the different mesh currents of the bridge as follows:

$$\begin{aligned} -Qi + (P+Q+\rho)i_1 - (P+Q)i_2 &= E \\ -Di - Pi_1 + (P+R)i_2 &= 0 \\ (A+D+R)i - Qi_1 + (A+Q)i_2 &= 0 \end{aligned} \quad (3)$$

From Equation (3), the current in the diagonal can be deduced as:

$$i = \frac{E(QR - AP)}{Z} \quad (4)$$

wherein:

$$Z = D\rho(A+P+Q+R) + D(A+R)(P+Q) + AR(P+Q) + PQ(A+R) + \rho(P+R)(A+Q). \quad (5)$$

Because the internal resistance, $\rho$, of source E has a negligible value compared to the values of resistors A, P, Q and R, the value of Z can be rewritten as:

$$Z = AR(P+Q) + PQ(A+R) + D(A+R)(P+Q). \quad (6)$$

Because the internal resistance D, of voltage detector $d$, is much greater than the sum of the resistances of the parallel connections of the two arms of the first branch and the parallel connections of the two arms of the second branch:

$$Z = D(A+R)(P+Q) \quad (7)$$

In other words, the value of D is much greater than:

$$\frac{AR}{A+R} + \frac{PQ}{P+Q}$$

which can be rewritten as:

$$\frac{AR(P+Q) + PQ(A+R)}{(A+R)(P+Q)}.$$

From Equations (4) and (7), the voltage u, across the diagonal of the bridge, can be represented as:

$$u = Di = \frac{E(QR - AP)}{(A+R)(P+Q)}. \quad (8)$$

Equation (9) represents the imbalance voltage of the bridge.

Because R designates the true value of the resistor R and $R_n$ represents the nominal value of the resistor R with the bridge at equilibrium, i.e., balanced, the product $Di = 0$ with the bridge in a balanced condition; at balance, the nominal value is: $R_n = AP/Q$, whereby $A = R_n Q/P$. Because $P/Q = k$, it is possible to write $A = R_n/k$.

With the bridge monitoring any value for resistor R, it is possible to write the product Di in the form:

$$Di = \frac{E(R - R_n)}{R_n(\frac{1}{k} + \frac{R}{R_n})(k+1)} \quad (9)$$

From Equations (2) and (9), it is possible to write the percentage error of resistor R compared to the nominal value for the resistor as:

$$X = \frac{100 \, Di(k+1)}{E} \cdot \left(\frac{1}{k} + \frac{R}{R_n}\right). \quad (10)$$

Because $R = R_n(1 + X/100)$, Equation (10) can be rewritten as:

$$X = \frac{100 \, Di(k+1)}{E} \cdot \left(\frac{k+1}{k} + \frac{X}{100}\right). \quad (11)$$

If the bridge is energized by an electromotive source E having a value of the form:

$$E = \frac{(k+1)^2 10^m}{k} \quad (12)$$

where $m$ = an integer,
Equation (11) can be rewritten as:

$$X = (100 \, Di \cdot 10^m)\left(\frac{k + 1 + \frac{kX}{100}}{k+1}\right). \quad (13)$$

If X/100 is negligible compared to (1 + 1/k), one can write:

$$X = 10^{(2-m)} Di \quad (14)$$

which can be rewritten as:

$$X = 10^{(2-m)} u, \quad (15)$$

if the bridge imbalance voltage is designated by $u = Di$.

The approximation that X/100 is negligible compared to (1 + 1/k) causes a systematic error. To eliminate this systematic error, the value of E is determined from Equation (11) in accordance with:

$$E = \left[\frac{(k+1)^2}{k} + \frac{X(k+1)}{100}\right]\frac{100 \, Di}{X}. \quad (16)$$

By substituting the value of X from Equation (15) into Equation (16), the value of E can be written as:

$$E = \frac{(k+1)^2}{k} \cdot 10^m + (k+1)u. \quad (17)$$

From Equation (17), the total systematic error can be eliminated if the bridge is energized with a voltage having a fixed component of the form $(k+1)^2/k \cdot 10^m$ and a variable component which increases as the percent error of the resistor R increases and is of the form $(k+1)u$. This variable voltage is proportional to the bridge imbalance voltage $u$. The apparatus for attaining the fixed and variable components of Equation (17) can be in the form illustrated by FIG. 2.

The equilibrium voltage of the bridge is expressed in volts. Because the percentage error X is proportional to the equilibrium of the bridge, it is possible to choose a voltmeter as a detector to read percentage error directly; in a typical instance, the voltmeter has a full scale reading of 100 volts to indicate errors as great as ± 100%. The polarity of the percent error is automatically indicated by the detector. When the positive electrode of voltage source E is directly connected to terminal 10 of the bridge, at the common terminal of resistors A and Q, and there is a connection of a positive terminal of detector $d$ to the common point 11 between resistors A and R, a positive voltage reading from detector $d$ corresponds to a positive value for X. For the same connections, a negative reading of detector $d$ corresponds to a negative percent error X.

To render X/100 negligible compared to the value of (1 + 1/k), k is selected to be much less than 1, such that a typical value of k is on the order of $10^{-2}$. The error in measuring X is equal to the error in the relative value of the imbalance voltage $u$, which depends upon the relative error in the value of E and on the initially determined value of Z, as determined from Equation (7). It is then possible to easily determine the admissible error by adjusting the value of E to the maximum permissible value for the internal resistance $\rho$ of the voltage source E, and also for the nominal admissible value of the internal resistance D of detector $d$.

With reference to FIG. 2, there is schematically illustrated a preferred apparatus for automatically measuring percent error in accordance with the invention. As mentioned supra, the bridge must be energized by a voltage source having the form:

$$\frac{(k+1)^2}{k} \cdot 10^m + (k+1)u.$$

To this end, voltage source E, having a low internal impedance, is connected to the bridge through differential amplifier 12, having a low output impedance. Voltage source E has a constant value in accordance with $(k+1)^2/k \cdot 10^m$ that is connected to input terminal 14 of differential amplifier 12. A second input to differential amplifier 15 is derived from circuit 13 and is variable in accordance with the relationship $(k+1)u$. Differential amplifier 12, which in a particular example is a Fairchild µA 723 differential amplifier, linearly combines the inputs thereof to derive an energizing voltage for the bridge in accordance with Equation (17). Circuit 13 increases the output voltage of differential amplifier 12 in accordance with the imbalance voltage developed across the diagonal of the bridge, i.e., the voltage detected by detector $d$.

Circuit 13 includes high input impedance, isolating amplifiers 19 and 20 having negative feedback stabilizing circuits and input terminals 18 and 17 respectively responsive to the voltages developed at the common taps between resistors R and A in the second branch and between resistors P and Q in the first branch; amplifiers 19 and 20 are preferably Fairchild amplifiers µA 740. The output voltages of amplifiers 19 and 20 are respectively supplied to the non-inverting and inverting input terminals 22 and 21 of DC operational amplifier 23, which is preferably a Fairchild µA 741 amplifier.

Amplifier 23 includes input and feedback resistors to establish the proportionality factor $(k+1)$. Input terminal 22 of amplifier 23 is connected to the common terminal for resistors Q and A through an input resistor. The common terminal between resistors Q and A is connected to the negative terminal of DC source E, as well as to ground. Thereby, at output terminal 16 of circuit 13, there is derived a DC voltage in accordance with $(k+1)u$. In this configuration, the voltage read by detector $d$ is automatically indicative of the tolerance or percent error of resistor R from the nominal value $R_n$ if the value of A is initially selected to achieve bridge balance when $R = R_n$, i.e., when $u$ (the voltage read by detector $d$) = 0, P/Q = $R_n$A. For subsequent readings, $u$ is equal to the percent error of R from $R_n$, i.e., $$\frac{100(R - R_n)}{R_n}.$$

While there has been described and illustrated one specific embodiment of the invention, it will be clear that variations in the details of the embodiment specifically illustrated and described may be made without departing from the true spirit and scope of the invention as defined in the appended claims.

What is claimed is:

1. Apparatus for automatically determining the percent error in the value R of an impedance from a nominal value $R_n$ of the impedance comprising a Wheatstone bridge including: first and second branches energized by a voltage source, said first branch including first and second series connected impedances respectively having values P and Q, said second branch including third and fourth series connected impedances respectively having values R and A, the third impedance being the impedance having the value R, a diagonal including a voltage detector connected across a common terminal of the first and second impedances and a common terminal of the third and fourth impedances, a voltage source for driving the first and second branches in parallel, said source having a value $$E = \frac{(k + 1)^2}{k} \cdot 10^m + (k + 1)u,$$

where:
$k = P/Q$,
$u$ = the voltage across the diagonal, and
$m$ = an integer,
whereby the value of $u$ is directly proportional to the percent error of R from $R_n$.

2. The apparatus of claim 1 wherein the fourth impedance has a value to establish bridge balance when $R = R_n$.

3. The apparatus of claim 2 wherein the source includes means for providing a fixed amplitude voltage component having a constant value proportional to $$\frac{(k + 1)^2}{k} \cdot 10^m,$$

and means for providing a variable amplitude voltage component having a value proportional to $(k+1)u$.

4. The apparatus of claim 3 wherein the means for providing the variable amplitude voltage component is connected to be responsive to the voltage across the diagonal.

5. The apparatus of claim 4 wherein the means for providing the variable component includes a differential amplifier having input terminals responsive to the voltage across the diagonal for deriving an output voltage proportional to the diagonal voltage, and means for linearly combining the output voltage and the fixed amplitude component.

6. The apparatus of claim 3 wherein the source has an internal impedance $p$ having a negligible value compared to the values of any of the values of A, P, Q, R, and the internal impedance value of the detector is much greater than $$\frac{AR}{A + R} + \frac{PQ}{P + Q}.$$

7. The apparatus of claim 1 wherein the source includes means for providing a fixed amplitude voltage component having a constant value proportional to $$\frac{(k + 1)^2}{k} \cdot 10^m,$$

and means for providing a variable amplitude voltage component having a value proportional to $(k+1)u$.

8. The apparatus of claim 7 wherein the means for providing the variable amplitude voltage component is connected to be responsive to the voltage across the diagonal.

9. The apparatus of claim 8 wherein the means for providing the variable component includes a differential amplifier having an input terminal responsive to the voltage across the diagonal for deriving an output voltage proportional to the diagonal voltage, and means for linearly combining the output voltage and the fixed amplitude component.

10. The apparatus of claim 7 wherein the source has an internal impedance $p$ having a negligible value compared to the values of any of the values A, P, Q, R, and the internal impedance value of the detector is much greater than $$\frac{AR}{A + R} + \frac{PQ}{P + Q}.$$

11. Apparatus for measuring the percentage error in the value of an impedance from a nominal value for the impedance comprising a Wheatstone bridge having first and second voltage dividers, each of said voltage dividers having a tap and being connected across a voltage source having a value E, a voltage detector connected in a diagonal of the bridge between the taps of the first and second voltage dividers, the first voltage divider including impedance means so that the voltage at the tap of the first divider equals $Ek/k+1$, where $k < < 1$ and is independent of the value of the measured impedance, the second divider including the measured impedance connected between the tap of the second divider and a terminal of the source so that when the bridge is balanced the voltage across the variable impedance equals $Ek/k+1$; the value of E being such that:

$$E = \frac{(k + 1)^2}{k} \cdot 10^m + (k + 1)u$$

where:
$u$ = the voltage across the bridge diagonal, and
$m$ = an integer,
whereby $u$ is directly proportional to the percentage error.

12. The apparatus of claim 11 wherein the first voltage divider includes first and second impedances respectively having values of P and Q, and second voltage divider includes third and fourth impedances respectively having values of R and A, whereby $P/Q = k$, the source having a negligible internal impedance, $p$, compared with the values of A, P, Q, and R, the value of A being variable to establish bridge equilibrium at the nominal value of the measured impedance so that at the nominal value of R, $R = kA$, the voltage detector having an internal resistance much larger than $$\frac{AR}{A + R} + \frac{PQ}{P + Q}.$$

13. A method of measuring the percentage error in the value of an impedance from a nominal value for the impedance with a Wheatstone bridge having first and second voltage dividers, each of said voltage dividers having a tap and being connected across a voltage source having a value E, a voltage detector connected in a diagonal of the bridge between the taps of the first and second voltage dividers, the first voltage divider including impedance means so that the voltage at the tap of the first divider equals $Ek/k+1$, where $k$ is independent of the value of the measured parameter, the second divider including the measured impedance connected between the tap of the second divider and a terminal of the source, so that when a bridge is balanced the voltage across the measured impedance equals $Ek/k+1$; comprising: selecting impedances of the first voltage divider so that $k<<1$, measuring the diagonal voltage $u$, and selecting the value of E such that:

$$E = \frac{(k+1)^2}{k} \cdot 10^m + (k+1)u,$$

where $m$ is an integer, and then reading the value of $u$ to determine the percentage error of the value of the measured impedance.

14. The method of claim 13 wherein the first voltage divider includes first and second impedances respectively having values of P and Q, the second voltage divider includes third and fourth impedances respectively having values of R and A, whereby $P/Q = k$, the source having a negligible internal impedance, $\rho$, compared with the values of A, P, Q, and R, varying the value of A until the bridge is in balance when the value R is the nominal value so that $R = kA$ at this time.

15. The method of claim 14 further comprising selecting a voltage detector having an internal impedance much greater than $$\frac{AR}{A+R} + \frac{PQ}{P+Q}.$$

* * * * *